United States Patent
Oka et al.

(10) Patent No.: US 8,299,601 B2
(45) Date of Patent: Oct. 30, 2012

(54) POWER SEMICONDUCTOR MODULE AND MANUFACTURING METHOD THEREOF

(75) Inventors: Seiji Oka, Tokyo (JP); Yoshiko Obiraki, Tokyo (JP); Takeshi Oi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 529 days.

(21) Appl. No.: 12/535,222

(22) Filed: Aug. 4, 2009

(65) Prior Publication Data

US 2010/0133684 A1  Jun. 3, 2010

(30) Foreign Application Priority Data

Nov. 28, 2008  (JP) ................. 2008-304545

(51) Int. Cl.
*H01L 23/48* (2006.01)
(52) U.S. Cl. ........ 257/693; 257/150; 257/177; 257/698; 257/717; 257/718
(58) Field of Classification Search .......... 257/150, 257/177, 693, 698, 717, 718; 438/121, 122, 438/124, 126, 127
See application file for complete search history.

(56) References Cited

U.S. PATENT DOCUMENTS

| 7,196,413 | B2 * | 3/2007 | Shibuya et al. | 257/707 |
| 7,816,781 | B2 * | 10/2010 | Thoben et al. | 257/693 |
| 2007/0215999 | A1 * | 9/2007 | Kashimoto et al. | 257/678 |
| 2008/0079145 | A1 * | 4/2008 | Tschirbs et al. | 257/706 |

FOREIGN PATENT DOCUMENTS

| JP | 59-78537 | 5/1984 |
| JP | 62-88347 | 4/1987 |
| JP | 63-165852 | 10/1988 |
| JP | 2007-184315 | 7/2007 |
| WO | WO 2008/090734 A1 | 7/2008 |

OTHER PUBLICATIONS

U.S. Appl. No. 13/086,499, filed Apr. 14, 2011, Oi, et al.
U.S. Appl. No. 13/150,593, filed Jun. 1, 2011, Oka, et al.
U.S. Appl. No. 12/504,225, filed Jul. 16, 2009, Oi, et.
U.S. Appl. No. 12/504,250, filed Jul. 16, 2009, Obiraki, et al.
U.S. Appl. No. 12/523,948, filed Jul. 21, 2009, Oka, et al.
U.S. Appl. No. 12/540,880, filed Aug. 13, 2009, Obiraki, et al.
Office Action issued Sep. 14, 2010, in Japanese Patent Application No. 2008-304545.
U.S. Appl. No. 12/577,376, filed Oct. 12, 2009, Obiraki, et al.
U.S. Appl. No. 12/582,025, filed Oct. 20, 2009, Oka, et al.

* cited by examiner

*Primary Examiner* — N Drew Richards
*Assistant Examiner* — Yu-Hsi D Sun
(74) *Attorney, Agent, or Firm* — Oblon, Spivak, McClelland, Maier & Neustadt, L.L.P.

(57) ABSTRACT

A power semiconductor module includes: a circuit board having a metal base plate, a high thermal conductive insulating layer, and a wiring pattern; power semiconductor elements electrically connected to the wiring pattern; tubular external terminal connection bodies provided to the wiring pattern for external terminals; and a transfer mold resin body encapsulated to expose through-holes in the metal base plate and used to fixedly attach cooling fins to the face of the metal base plate on the other side with attachment members, the face of the metal base plate on the other side, and top portions of the tubular external terminal connection bodies, to form insertion holes for the attachment members communicating with the through-holes and having a larger diameter than the through-holes, and to cover the one side and side faces of the metal base plate and the power semiconductor elements.

3 Claims, 6 Drawing Sheets

POWER SEMICONDUCTOR MODULE AND MANUFACTURING METHOD THEREOF

BACKGROUND OF THE INVENTION

1. Field of the Invention

The present invention relates to a resin-encapsulated power semiconductor module by transfer molding having excellent productivity, and more particularly, to a resin-encapsulated power semiconductor module by transfer molding that achieves a size reduction and high reliability and a manufacturing method thereof.

2. Background Art

A power semiconductor module generally operates at a large current and a high voltage. It is therefore essential to release heat generated in association with the operation efficiently to the outside of the power semiconductor module. To this end, the power semiconductor module is formed by encapsulating components including power semiconductor elements, an insulating substrate with wiring pattern, a metal base plate, and external terminal connection bodies with transfer mold resin.

Performance requirements of the power semiconductor module as above are to reduce thermal resistance and ensure high insulation qualities. Moreover, it is crucial to achieve a size reduction and high reliability.

As means for achieving a size reduction for the resin-encapsulated power semiconductor module by transfer molding, it has been proposed to expose the top portion of an electrically conductive tubular external terminal connection body to the surface of the top face of the resin encapsulated region by transfer molding.

A resin-encapsulated power semiconductor module by transfer molding disclosed, for example, in JP-A-2007-184315 has power semiconductor elements that switch a current, an insulating substrate with circuit pattern to which the power semiconductor elements are bonded and electrically connected, a metal base to which the insulating substrate with circuit pattern is bonded. Tubular female connectors to be connected to the external terminal are exposed to the surface of the top face of the resin encapsulated region by transfer molding of the insulating substrate with circuit pattern. A groove is formed on the surface of the metal base in the vicinity of the periphery of the insulating substrate with circuit pattern. The insulating substrate with circuit pattern together with the groove formed on the metal base surface is encapsulated with resin by transfer molding. The encapsulated region is on the inner side of the outermost peripheral region of the metal base. In other words, it is configured in such a manner that the outer peripheral portion on the outside of the encapsulated region of the metal base is exposed, and attachment holes for cooling fins attached to the backside of the metal base are provided to the exposed portion in the outer peripheral portion of the metal base.

The power semiconductor module of the cited reference is configured in such a manner that the surface of the top portion of the tubular female connector is exposed to the surface of the top face of the encapsulated region. Accordingly, the external terminal is inserted into the female connector. Owing to this structure, a size of the power semiconductor module encapsulated with transfer mold resin can be reduced.

Also, the configuration to expose all the external terminal connection bodies to the surface of the top face of the encapsulated region with transfer mold resin so as to be extracted from the top face is advantageous over a power semiconductor module encapsulated with transfer mold resin of a laterally protruding external terminal structure using a typical lead frame in that not only the size can be reduced but also the manufacturing steps can be simpler.

Further, forming the groove in the metal base provides a penetration effect of the encapsulation resin. At the same time, adhesion properties can be enhanced by a stress mitigation effect provided by applying polyamide resin. Consequently, because peeling is suppressed, it is possible to obtain a power semiconductor module capable of enhancing the reliability.

In the power semiconductor module in the related art, the top portions of all the external terminal connection bodies are placed so as to be exposed to the surface of the top face of the encapsulated region. This configuration makes it possible to place the external terminals so that they can be extracted within the top face of the encapsulated region and is therefore advantageous in reducing the size. However, because the attachment holes for the cooling fins made in the metal base are provided on the outside of the encapsulated region, the external terminal connection bodies cannot be provided in the exposed metal base region. Hence, there is a problem that it is difficult to reduce the size of the overall power semiconductor module because of the area of the exposed metal base.

In addition, it is necessary to form the groove in the metal base in order to obtain the peeling suppression effect by enhancing the adhesion properties between the metal base and the encapsulation resin, and it is also necessary to apply special processing, such as applying polyamide resin. The manufacturing costs are consequently increased.

Further, a warping condition, that is, elastic deformation at a given position differs between the metal base in the encapsulated region and the metal base exposed on the outside of the encapsulated region. This poses a problem that it becomes difficult to obtain high reliability.

SUMMARY OF THE INVENTION

The invention was devised to solve the problems discussed above and has an object to provide a power semiconductor module configured in such a manner that the top portion of the tubular external terminal connection body is exposed to the surface of the top face of the encapsulated region and capable of achieving a size reduction and high reliability.

A power semiconductor module according to one aspect of the invention includes: a circuit board formed of a metal base plate, a high thermal conductive insulating layer joined to a face of the metal base plate on one side, and a wiring pattern provided to a face of the high thermal conductive insulating layer on a side opposite to the face joined to the metal base plate; a power semiconductor element joined to an element mount portion of the wiring pattern; a tubular external terminal connection body provided to the wiring pattern, to which an external terminal is connected by insertion; and a transfer mold resin body encapsulated in such a manner that a face of the metal base plate on the other side and a top portion of the tubular external terminal connection body are exposed, and the one side and side faces of the metal base plate, the power semiconductor element, and the tubular external terminal connection body are covered. The metal base plate is provided with a through-hole used to place an attachment member that fixes a cooling fin to the face of the metal base plate on the other side. The transfer mold resin body is provided with an insertion hole for the attachment member communicating with the through-hole and having a diameter larger than a diameter of the through-hole.

A method of manufacturing a power semiconductor module according to another aspect of the invention includes: forming a construct by mounting a power semiconductor element and a tubular external terminal connection body on a circuit board formed of a metal base plate, a high terminal conductive insulating layer joined to a face of the metal base plate on one side, and a wiring pattern provided to a face of the high thermal conductive insulating layer on a side opposite to the face joined to the metal base plate, and by forming a circuit forming portion that electrically connects the power semiconductor element and the wiring pattern; providing the metal base plate with a through-hole to place an attachment member that fixes a cooling fin to a face of the metal base plate on the other side; clogging the through-hole with a molded product in order to form an insertion hole for the attachment member communicating with the through-hole and having a diameter larger than a diameter of the through-hole; and forming a transfer mold resin body by placing the construct in which the through-hole is clogged with the molded product inside a die by placing the face of the metal base plate on the other side to abut on an inner bottom face of the die and placing a top portion of the tubular external terminal connection body and a top portion of the molded product to abut on an inner top face of the die while maintaining a predetermined interval between side faces of the metal base plate and inner side faces of the die, and by filling a clearing portion defied by the construct and molded product inside the die with mold resin.

According to the invention, the power semiconductor module includes a circuit board formed of a metal base plate, a high thermal conductive insulating layer joined to a face the metal base plate on one side, and a wiring pattern provided to a face of the high thermal conductive insulating layer on the side opposite to the face joined to the metal base plate, a power semiconductor element joined to an element mount portion of the wiring pattern, a tubular external terminal connection body provided to the wiring pattern, to which an external terminal is connected by insertion, and a transfer mold resin body encapsulated in such a manner that a face of the metal base on the other side and a top portion of the tubular external terminal connection body are exposed and the one side and side faces of the metal base plate, the power semiconductor element, and the tubular external terminal connection body are covered. The metal base plate is provided with a through-hole to place an attachment member that fixes a cooling fin to the face of the metal base plate on the other side. The transfer mold resin body is provided with an insertion hole that communicates with the through-hole and has a diameter larger than the diameter of the through-hole. Accordingly, the side portions of the metal base plate provided with the through-hole can be placed within the encapsulated region of the transfer mold resin body. It thus becomes possible to obtain a power semiconductor module capable of achieving a size reduction and high reliability.

The foregoing and other object, features, aspects, and advantages of the present invention will become more apparent from the following detailed description of the present invention when taken in conjunction with the accompanying drawings.

DESCRIPTION OF THE PREFERRED EMBODIMENTS

First Embodiment

Figure 1:
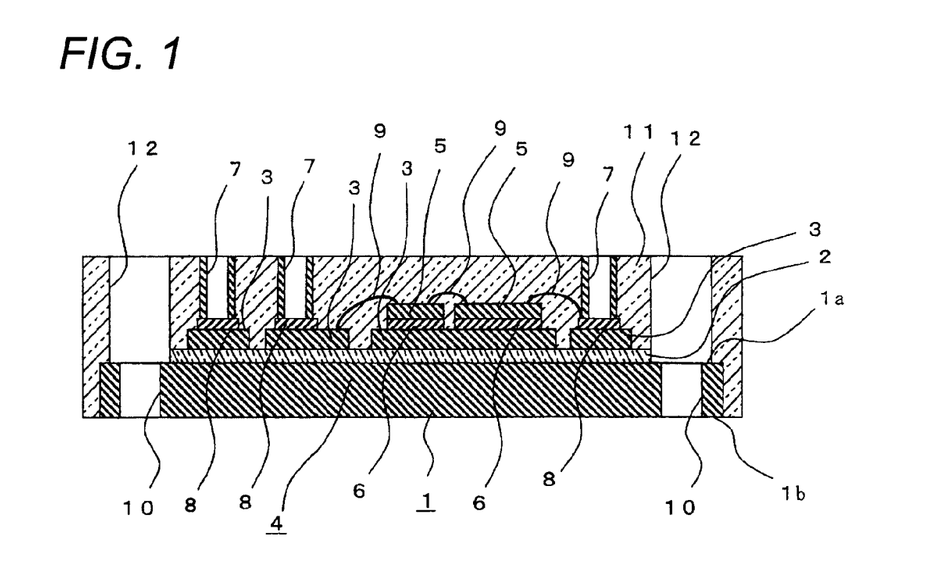
FIG. 1 is a cross section taken on line X-X of FIG. 2 showing a power semiconductor module according to a first embodiment of the invention.
Figure 2:
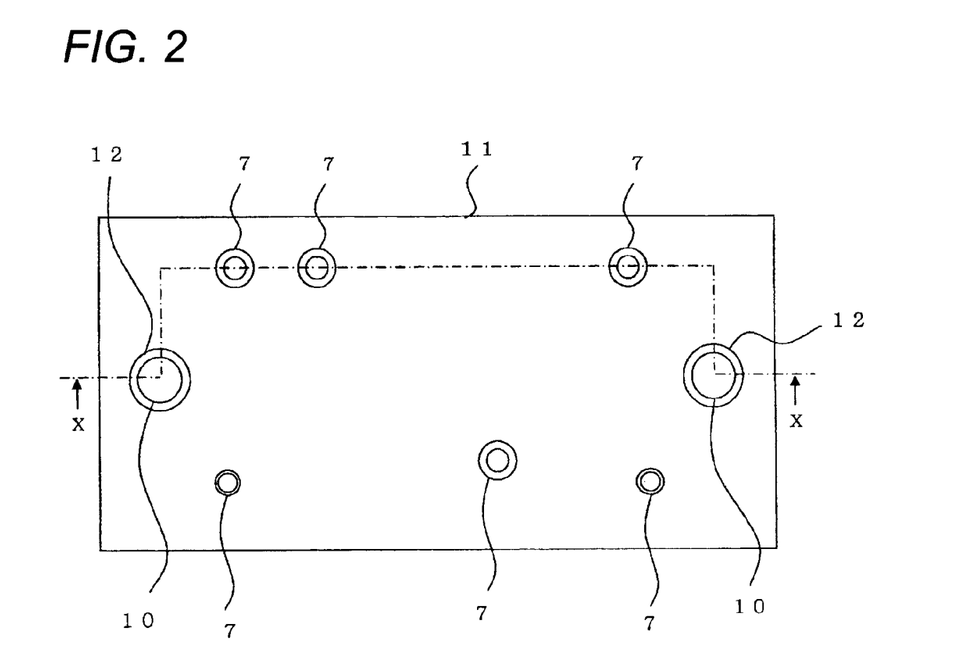
FIG. 2 is a plan view showing the power semiconductor module according to the first embodiment of the invention.

Hereinafter, a power semiconductor module according to a first embodiment of the invention will be described with reference to FIG. 1 and FIG. 2. FIG. 1 is a cross section taken on line X-X of FIG. 2 and FIG. 2 is a plan view.

Referring to these drawings, numeral 1 denotes a metal base plate, which is a metal radiator, numeral 2 denotes a resin insulating layer, which is a high thermal conductive insulating layer, joined to a face 1a of the metal base plate 1 on one side, and numeral 3 denotes a wiring pattern, for example, of metal foil provided on the face of the resin insulating layer 2, which is a high thermal conductive insulating layer, on the opposite side of the face joined to the metal base plate 1. A circuit board 4 is formed of the metal base plate 1, the resin insulating layer 2, and the wiring pattern 3. Numeral 5 denotes a power semiconductor element joined to an element mount portion of the wiring pattern 3 of the circuit board 4 using a solder 6, numeral 7 denotes a tubular external terminal connection body placed substantially vertically to the wiring pattern 3, which is electrically connected to the power semiconductor element 5, using a solder 8, to which an unillustrated external terminal is connected by insertion, numeral 9 denotes wire bonds, which are circuit forming portions that electrically connect one wiring pattern 3 and another wiring pattern 3, one power semiconductor element 5 and another power semiconductor element 5, and the wiring pattern 3 and the power semiconductor element 5.

Numeral 10 denotes a through-hole made in the metal base plate 1 and used to place an attachment member described below that fixes cooling fins described below by causing the cooling fins to abut on the face 1b of the metal base 1 on the other side. Also, the head portion of the attachment member is allowed to come into contact with the metal surface of the metal base plate 1 on the outer rim portion of the through-hole 10.

Numeral 11 denotes a transfer mold resin body encapsulated in such a manner that the face 1b of the metal base plate 1 on the other side and the top portions of the tubular external terminal connection bodies 7 are exposed and one side and the side faces of the metal base plate 1, the power semiconductor elements 5, and the tubular external terminal connection bodies 7 are covered. The transfer mold resin body 11 is provided with insertion holes 12 for the attachment members that communicate with the through-holes 10 and have a diameter larger than the diameter of the through-holes 10. The transfer mold resin body 11 on the metal base plate 1 is formed in such a manner that it becomes higher than the head portions of the attachment members inserted into the insertion holes 12.

In the first embodiment, the metal base plate 1 can be made of metal having excellent thermal conductivity, for example, copper and copper alloy, aluminum and aluminum alloy, iron and iron alloy, or composite materials, such as copper/iron-nickel alloy/copper, and aluminum/iron-nickel alloy/aluminum. In particular, in a case where a power semiconductor element 5 having a large current capacity is used, it is preferable to use copper having excellent thermal conductivity because high thermal conductivity is required. In addition, the thickness, the length, and the width of the metal base plate 1 are determined appropriately by a current capacity of the power semiconductor element 5. More specifically, when a current capacity of the power semiconductor element 5 becomes larger, the metal base plate 1 becomes thicker, longer, and wider. In a case where a lower cost and a lighter weight are required, it is preferable to use aluminum or aluminum alloy.

In the first embodiment, for the resin insulating layer 2, which is a high thermal conductive insulating layer, for example, a resin insulating sheet containing various types of inorganic powder, and a resin insulating sheet containing glass fiber can be used. The inorganic powder contained in the resin insulating layer 2 includes alumina, beryllia, boron nitride, magnesia, silica, silicon nitride, and aluminum nitride. The thickness of the resin insulating layer 2 is, for example, 20 to 400 μm.

Also, in the first embodiment, for example, copper foil is used for the wiring pattern 3 and an aluminum wire is used for the wire bonds 9. The thickness of the copper foil used for the wiring pattern 3 and the wire diameter of the aluminum wire used for the wire bonds 9 are also determined appropriately by the current capacity of the power semiconductor element 5.

Also, in the first embodiment, for example, a metal tube is used for the tubular external terminal connection bodies 7, and a material thereof is preferably metals with excellent thermal conductivity and electrical conductivity that can be joined to the wiring pattern 3 using the solder 8, for example, plated goods of copper and copper alloy, aluminum and aluminum alloy. It is sufficient for the tubular external terminal connection bodies 7 to have a thickness thick enough not to be broken by a molding pressure during encapsulation with transfer mold resin. Also, it is sufficient for the tubular external terminal connection bodies 7 to have a height high enough for the external terminal that will be connected by insertion later to be connected in a satisfactory manner. The minor diameter of the tubular external terminal connection bodies 7 is determined by the major diameter of the insertion portion of the external terminal that will be connected by insertion later, and a minor diameter at least large enough to attach the external terminal is sufficient.

Also, in the first embodiment, for example, epoxy resin filled with silica powder is used as a filler for the transfer mold resin body 11. Regarding a content percentage of the silica powder to be filled in the transfer mold resin body 11, an optimal amount is selected by giving consideration to a thermal expansion coefficient of a member used in the power semiconductor module. For example, in a case where copper is used for the wiring pattern 3 and the metal base plate 1, a filling amount of the silica powder into the epoxy resin is set in such a manner that the thermal expansion coefficient of the transfer mold resin body 11 coincides with the thermal expansion coefficient of copper, 16 ppm/°C. Consequently, a power semiconductor module causing no warping can be obtained. In addition, in a case where the heat dissipation of the transfer mold resin body 11 is enhanced, it is preferable to use alumina powder as the filler instead of silica powder.

Figure 3:
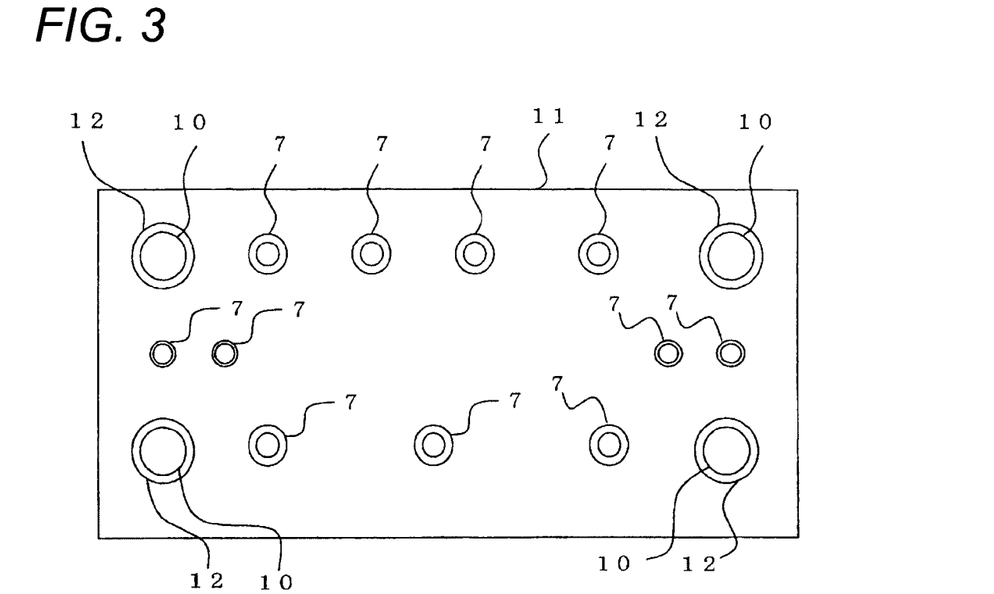
FIG. 3 is a plan view showing another example of the power semiconductor module according to the first embodiment of the invention.

FIG. 2 is a plan view of the power semiconductor module. As can be obvious from the drawing, the through-holes 10 and the insertion holes 12 are made in the power semiconductor module on the right and on the left. FIG. 3 shows a case where the through-holes 10 and the insertion holes 12 are made at the four corners of the power semiconductor module. Both FIG. 2 and FIG. 3 show that the top portions of the electrically conductive tubular external terminal connection bodies 7 and the through-holes 10 and the insertion holes 12 used to fix the cooling fins to the face 1b of the metal base plate 1 on the other side with attachment members are exposed to the encapsulation surface of the transfer mold resin body 11. The tubular external terminal connection bodies 7 are provided at various positions and the number and sizes are selected in various manners so as to suit the use of the power semiconductor module. The transfer mold resin body 11 is encapsulated in such a manner that the face 1b of the metal base plate 1 on the other side and the top portions of the tubular external terminal connection bodies 7 are exposed, and the insertion holes 12 for the attachment members communicating with the through-holes 10 and having a diameter larger than the diameter of the through-holes 10 are formed while the one side and the side faces of the metal base plate 1 and the power semiconductor elements 5 are covered. It is therefore possible to ensure a sufficient creeping distance between the metal base plate 1 and the electrically conductive tubular external terminal connection bodies 7 to which the external terminals are connected by insertion. Consequently, it becomes possible to provide the tubular external terminal connection bodies 7 in the vicinity of the through-holes 10 and the insertion holes 12, which enables a size reduction of the power semiconductor module.

A state where the cooling fins are attached to the face 1b of the metal base plate 1 on the other side in the power semiconductor module described above with reference to FIG. 1 will now be described with reference to FIG. 4.

Figure 4:
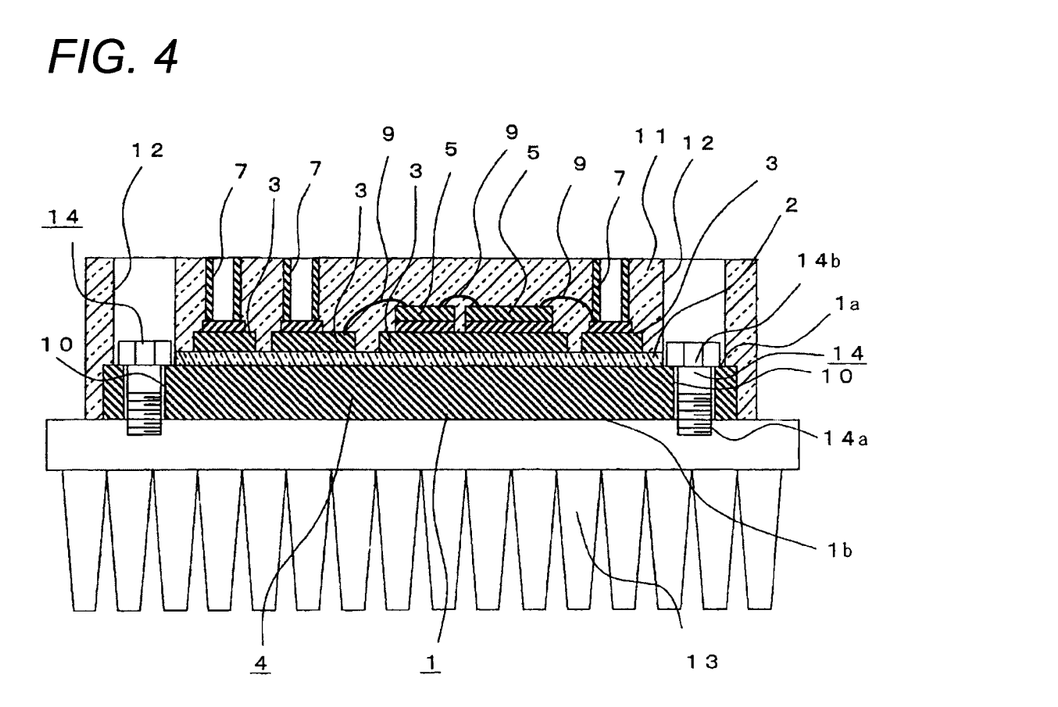
FIG. 4 is a cross section showing a state where cooling fins are joined in the power semiconductor module according to the first embodiment of the invention.

In FIG. 4, numerals 1 through 12 denote components same as those in the configuration of FIG. 1. Numeral 13 denotes cooling fins attached so as to abut on the face 1b of the metal base plate 1 on the other side, numeral 14 denotes attachment members (hereinafter, referred to as bolts) formed, for example, of bolts that are inserted from the open top portions of the insertion holes 12 formed by the transfer mold resin body 11 into the insertion holes 12 and the through-holes 10 made in the metal base plate 1 so as to attach and fix the cooling fins 13 to the metal base plate 1. By threading a screw portion 14a of the bolt 14 into the cooling fins 13, the cooling fins 13 are attached and fixed to the face 1b of the metal base plate 1 on the other side. For example, grease or the like is applied between the cooling fins 13 and the face 1b of the metal base plate 1 on the other side in order to maintain mutual adhesion. It is necessary to maintain the metal base plate 1 and the cooling fins 13 at the same potential whereas the grease used has insulating properties. Accordingly, the cooling fins 13 are fixed to the metal base plate 1 by fastening the former to the latter with the bolts 14 while the head portions 14b of the bolts 14 come into contact with the exposed metal surface of the metal base plate 1 in the outer rim portions of the through-holes 10. Because the head portions 14b of the bolts 14 come in contact with the exposed metal surface of the metal base plate 1 in this manner, the metal base plate 1 and the cooling fins 13 can be maintained at the same potential and electrical suspended components can be cancelled. It thus becomes possible to achieve the higher reliability.

Also, because it is possible to ensure a sufficient creeping distance between the bolts 14 and the tubular external terminal connection bodies 7, the tubular external terminal connection bodies 7 can be provided in the vicinity of the bolts 14, which enables a size reduction of the power semiconductor module.

Also, by providing the head portions of the bolts 14 at positions lower than the encapsulation surface of the transfer mold resin body 11, the creeping distance becomes longer. Further, the electrically conductive tubular external terminal connection bodies 7 can be mounted in the vicinity of the through-holes 10 and the insertion holes 12. Likewise, by increasing the height of the transfer mold resin body 11 on the metal base plate 1, the creeping distance becomes longer and the tubular external terminal connection bodies 7 can be mounted in the further vicinity of the through-holes 10 and the insertion holes 12, which enables a further size reduction of the power semiconductor module.

The above described a case where bolts are used as the attachment members 14. It should be appreciated, however, that the same advantage can be achieved when the attachment members 14 formed of screws are used.

In the cited reference, the reliability of the module is increased by means of applying groove processing to the metal base plate and applying polyamide resin in a uniform thickness. However, not only special groove processing is required, but also the cost is increased. Further, because a special step of applying polyamide resin is required, the total cost is increased.

On the contrary, in the first embodiment of the invention, the transfer mold resin body 11 is structured in such a manner that the face 1b of the metal base plate 1 on the other side and the top portions of the tubular external terminal connection bodies 7 are exposed and the insertion holes 12 for the attachment members communicating with the through-holes 10 and having a diameter larger than the diameter of the through-holes 10 are formed while one side and the side faces of the metal base plate 1 and the power semiconductor elements 5 are covered. Hence, in comparison with the module structure in which the composite substrate is encapsulated with the encapsulation resin only on the plane as in the cited reference, a drag against peeling at the module end portion exerts for the shearing force that causes the peeling. Sufficient adhesion strength can be thus obtained. Accordingly, a peeling suppression effect can be achieved without applying the groove processing to the metal base plate 1 and performing the step of applying polyamide resin. Hence, not only can the cost be reduced, but also high reliability can be achieved.

In the first embodiment of the invention, the side portions of the metal base plate 1 are formed integrally with the transfer mold resin body 11 except for the face on the other side of the metal base plate 1. Hence, in comparison with the module structure in which the base plate is exposed to the outside of the encapsulated region with the encapsulation resin as in the cited reference, warping of the module structure can be reduced easily by optimizing the thermal expansion coefficient of the transfer mold resin body 11. It thus becomes possible to achieve higher reliability. In other words, the thermal expansion coefficient of the transfer mold resin body 11 is selected so as to coincide with the thermal coefficient of the metal base plate 1. For example, in a case where the metal base plate 1 is made of copper, because the thermal expansion coefficient of copper is 16 ppm/° C., the transfer mold resin body 11 is selected so that the thermal expansion coefficient of the transfer mold resin body 11 becomes 15 to 18 ppm/° C.

Figure 5:
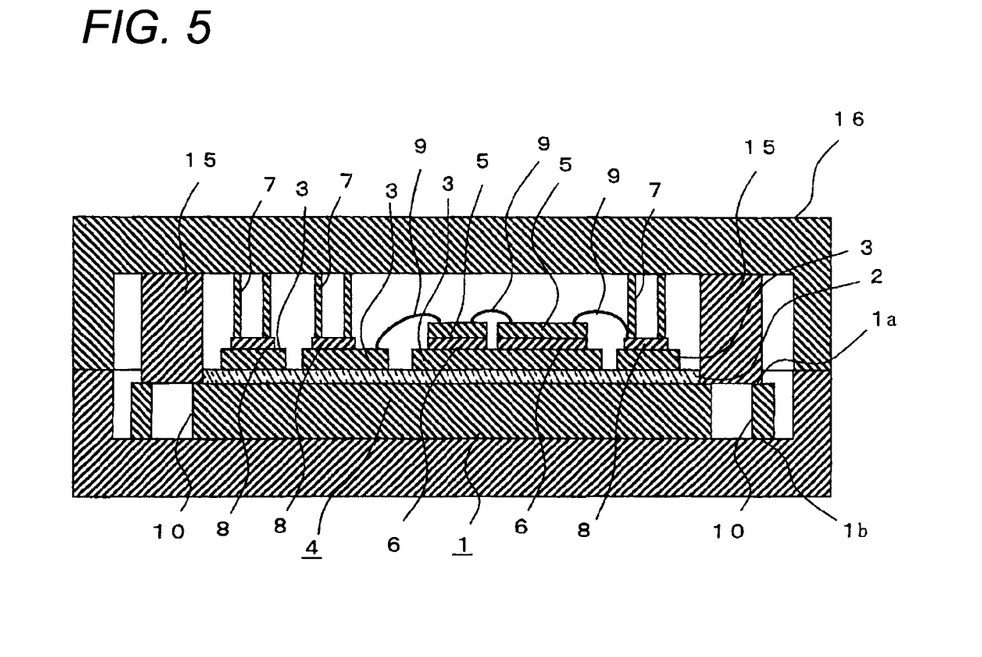
FIG. 5 is a cross section showing a manufacturing method of a power semiconductor module according to a second embodiment of the invention.

As has been described, by using the power semiconductor module of the first embodiment, it becomes possible to achieve the advantages unachieved by the related art, that is, not only the module can be reduce in size but also the reliability, such as suppression of peeling and a reduction of warping of the module structure, can be enhanced markedly.
Second Embodiment A second embodiment of the invention will describe a method of manufacturing the power semiconductor module shown in FIG. 1 with reference to FIG. 5. FIG. 5 shows a method of manufacturing a power semiconductor module by performing the steps of: forming a construct by mounting power semiconductor elements 5 and tubular external terminal connection bodies 7 on a circuit board 4 formed of a metal base plate 1, a resin insulating layer 2, which is a high terminal conductive insulating layer, joined to a face 1a of the metal base plate 1 on one side, and a wiring pattern 3 provided to a face of the resin insulating layer 2 on a side opposite to the face joined to the metal base plate 1, and by forming circuit forming portions formed of wire bonds 9 that electrically connect the respective power semiconductor elements 5 and the wiring pattern 3; providing the metal base plate 1 with through-holes 10 to place bolts 14 that fix cooling fins 13 to a face 1b of the metal base plate 1 on the other side; clogging the through-holes 10 with molded products 15 in order to form insertion holes 12 for the bolts 14 communicating with the through-holes 10 made in the metal base plate 1 and having a diameter larger than the diameter of the through-holes 10; and forming a transfer mold resin body 11 by placing the construct in which the through-holes 10 are clogged with the molded products 15 inside a die 16 by placing the face 1b of the metal base plate 1 on the other side to abut on an inner bottom face of the die 16 and placing the top portions of the tubular external terminal connection bodies 7 and the top portion of the molded products 15 to abut on an inner top face of the die 16 while maintaining a predetermined interval between side faces of the metal base plate 1 and inner side faces of the die 16, and by filling a clearing portion defied by the construct and molded products 15 inside the die 16 with mold resin.

The manufacturing method including the respective steps as described above will now be described in detail. It is normal that the through-holes 10 are preliminarily made in the metal base plate 1 of the circuit board 4. The construct is formed by mounting the power semiconductor elements 5 and the tubular external terminal connection portions 7 on the circuit board 4. In order to from the insertion holes 12 for the bolts 14 communicating with the through-holes 10 and having a diameter larger than the diameter of the through-holes 10, the through-holes 10 are clogged with molded products 15. The construct in which the through-holes 10 are clogged with the molded products 15 is positioned inside the die 16 by placing the face 1b of the metal plate 1 on the other side to abut on the inner bottom surface of the die 16 and placing the top portions of the tubular external terminal connection bodies 7 and the top portions of the molded products 15 to abut on the inner top face of the die 16 while maintaining a predetermined interval between the side faces of the metal base plate 1 and the inner side faces of the die 16. After the positioning, a clearing portion defined by the construct and the molded products 15 inside the die 16 is filled with mold resin, for example, epoxy resin filled with silica powder, as a filler. The transfer mold resin body 11 is thus formed. Thereafter, the die 16 is released from the transfer mold resin body 11 followed by curing. The insertion holes 12 for the bolts 14 communicating with the through-holes 10 and having a diameter larger than the diameter of the through-holes 10 are formed by removing the molded products 15. The manufacturing of the power semiconductor module described above with reference to FIG. 1 is thus completed.

Figure 6A:
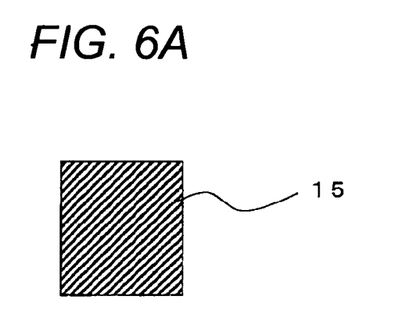
FIG. 6A and FIG. 6B are cross sections showing molded products of the power semiconductor module according to the second embodiment of the invention.

The molded products 15 shown in FIG. 5 are formed, for example, in the shape of a simple circular column as shown in FIG. 6A. In this case, because the molded products 15 are of a simple shape, it may be necessary to position the molded products 15 so as to clog the through-holes 10.

Figure 6B:
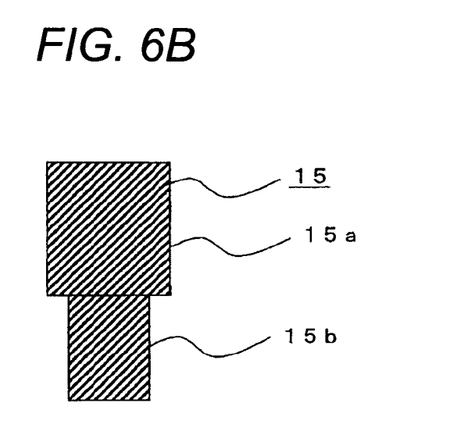

Alternatively, the molded products 15 may be formed as shown in FIG. 6B. This molded product 15 has a circular column portion 15a to clog the through-holes 10 and a positioning portion 15b provided nearly concentrically with the circular column portion 15a and inserted into the through-hole 10. In this case, by merely inserting the positioning portion 15b of the molded product 15 into the through-hole 10, the circular column portion 15a of the molded product 15 to clog the through-hole 10 can be positioned. Accordingly, the insertion holes 12 can be formed accurately without causing any positional displacement of the insertion holes 12. Hence, there can be achieved an advantage that the reliability and the workability can be enhanced in comparison with the molded products 15 shown in FIG. 6A.

Regarding the shape of the molded products 15, in order to remove the transfer mold resin body 11 easily after the transfer mold resin body 11 is formed, it is preferable to provide the molded products 15 with tapers to the extent that there will be no problem in attaching and removing of the bolts 14. Also, in order to facilitate the removal, it is preferable that the molded products 15 are made of a material that does not bond to the transfer mold resin body 11. An example is a molded product of Teflon (registered trademark) or a molded product obtained by coating the metal surface with Teflon (registered trademark). In terms of the dimensional accuracy and durability, the molded product 15 obtained by coating the metal surface with Teflon (registered trademark) excels the other. However, in terms of absorption of irregularity in thickness of the metal base plate 1, it is preferable to use a molded product of Teflon (registered trademark) as the molded product 15. More specifically, because a Teflon (registered trademark) material undergoes elastic deformation, even when the thickness of the metal base plate 1 varies, a tolerance is absorbed. It thus becomes possible to prevent mold resin from running onto the through-holes 10 made in the metal base plate 1 and used to attach the cooling fins 13.

Third Embodiment

Figure 7:
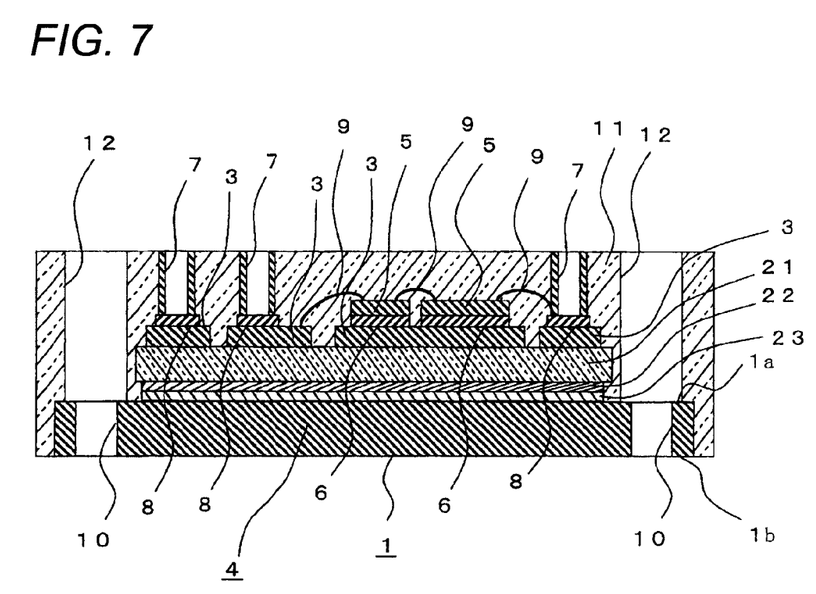
FIG. 7 is a cross section showing a power semiconductor module according to a third embodiment of the invention.

A third embodiment of the invention will be described with reference to FIG. 7. The third embodiment shows another construct in the circuit board 4 of the first embodiment described above. More specifically, a ceramic plate 21, which is a high thermal conductive insulating layer, is provided instead of the resin insulating layer 2. Metal foil 22, which is a metal radiator, is provided to the face of the ceramic plate 21 on the side of the metal base plate 1. A wiring pattern 3 is provided to the face of the ceramic plate 21 on the side opposite to the face where the metal foil 22 is provided. The metal foil 22 on the ceramic plate 21 is joined to the metal base plate 1 by a solder 23. The other configurations are the same as the configurations of the first embodiment described above. The same advantages as those of the first embodiment above can be achieved also in the third embodiment. The ceramic plate 21 is made of materials, such as alumina, aluminum nitride, and silicon nitride.

Fourth Embodiment

Figure 8:
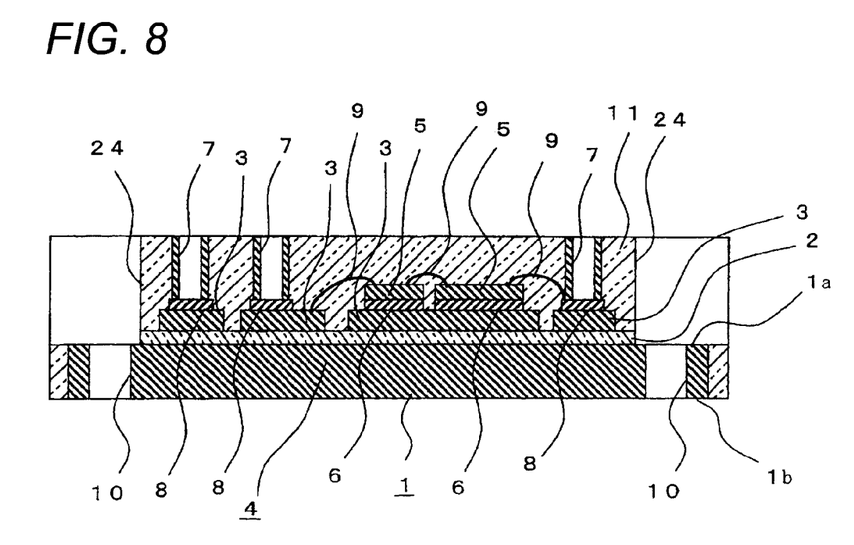
FIG. 8 is a cross section showing a power semiconductor module according to a fourth embodiment of the invention.
Figure 9:
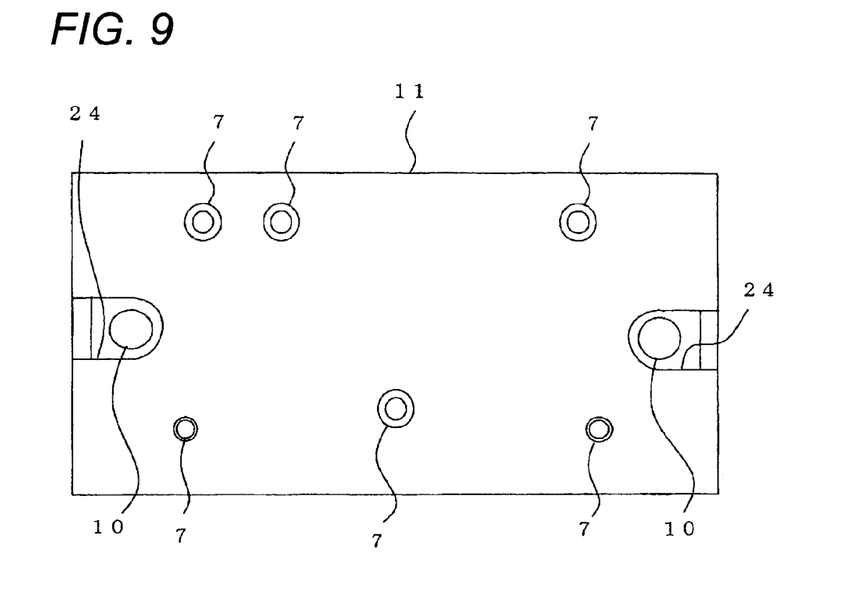
FIG. 9 is a plan view showing the power semiconductor module according to the fourth embodiment of the invention.
Figure 10:
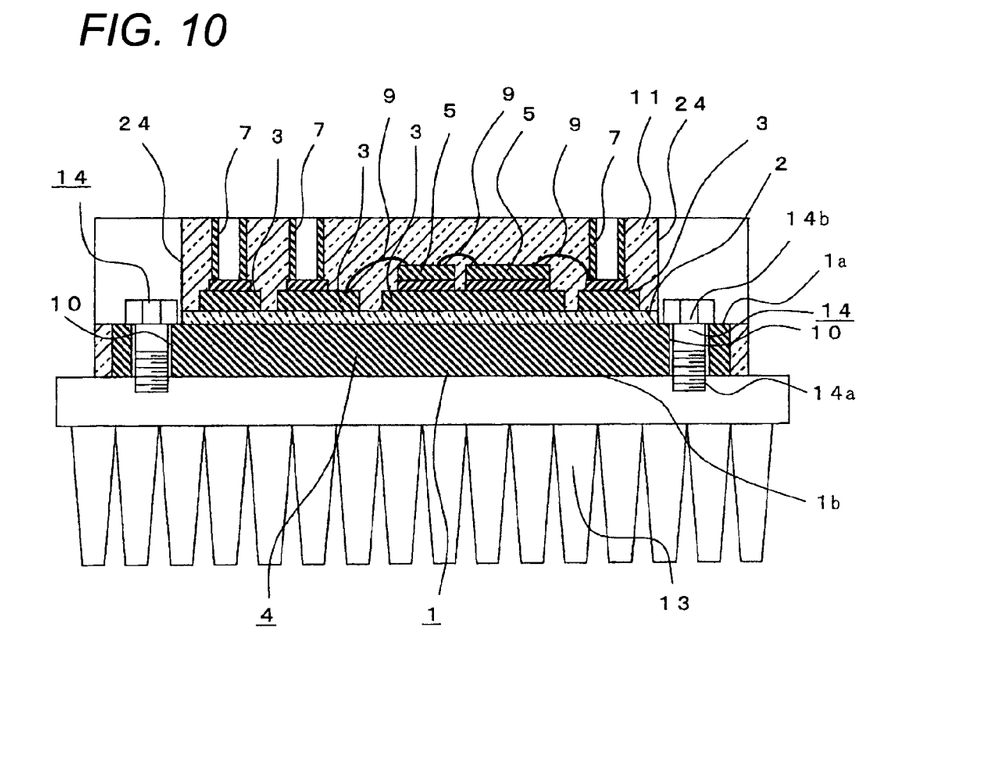
FIG. 10 is a cross section showing a state where cooling fins are joined in the power semiconductor module according to the fourth embodiment of the invention.

A fourth embodiment of the invention will be described with reference to FIG. 8 through FIG. 10. FIG. 8 is a cross section, FIG. 9 is a plan view, and FIG. 10 is a cross section showing a state where the cooling fins are attached. In these drawings, numerals 1 through 11, 13, and 14 denote the same components as those in the first embodiment described above. A difference of the fourth embodiment from the first embodiment above is the shape of insertion holes for the bolts 14 communicating with the through-holes 10 and having a diameter larger than the diameter of the through-holes 10. In contrast to the insertion holes 12 of the first embodiment above having a circular shape, insertion holes 24 of the fourth embodiment are formed to open also to the side faces of the transfer mold resin body 11. In short, the insertion holes 24 open not only in the direction to the top face but also in the direction to the side face.

According to the fourth embodiment, in a case where the cooling fins 13 are attached and fixed to the metal base plate 1, the cooling fins 13 are attached and fixed to the metal base plate 1 not by inserting the bolts 14 from the open top portions of the insertion holes 12 into the insertion holes 12 and the through-holes 10 as in the first embodiment above, but the cooling fins 13 can be attached and fixed to the metal base plate 1 by inserting the bolts 14 through the insertion holes 24 and the through-holes 10 from the side faces of the insertion holes 24. The workability when attaching the bolts 14 can be thus enhanced.

Fifth Embodiment

Figure 11:
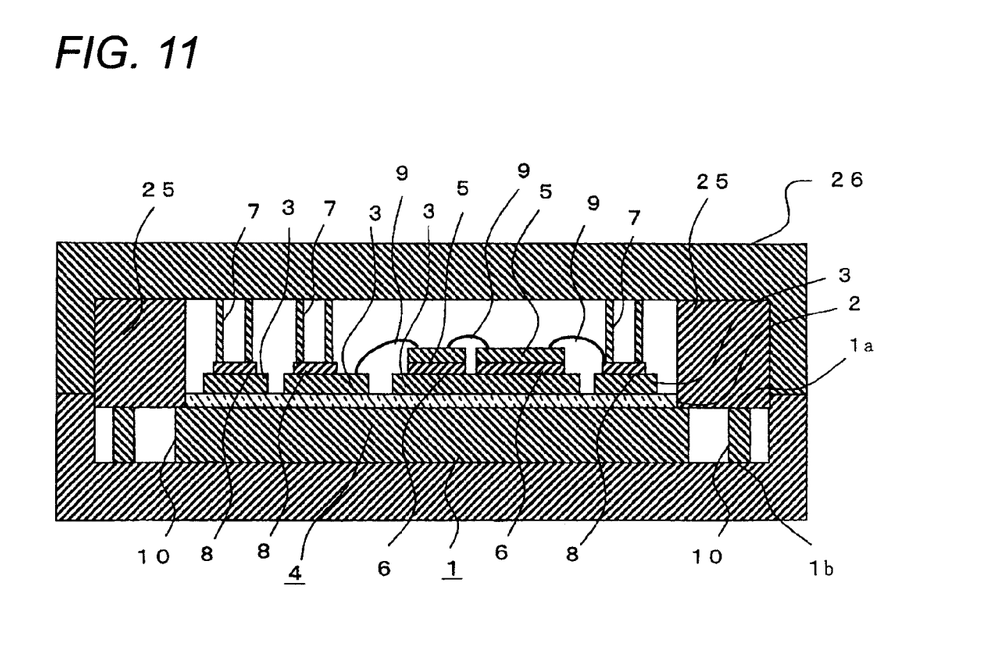
FIG. 11 is a cross section showing a manufacturing method of a power semiconductor module according to a fifth embodiment of the invention.
Figure 12:
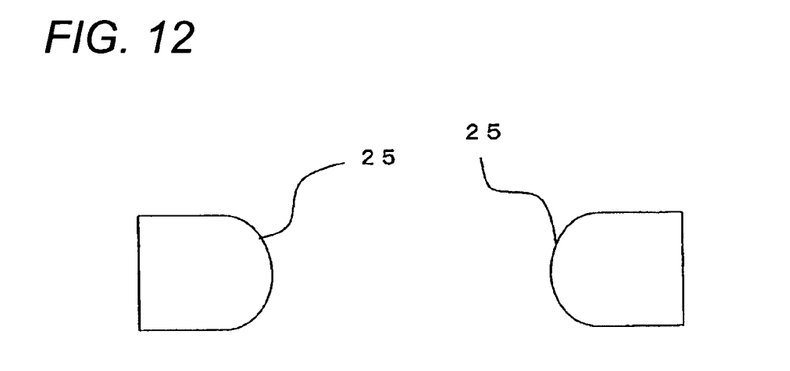
FIG. 12 is a cross section showing molded products of the power semiconductor module according to the fifth embodiment of the invention.

A fifth embodiment of the invention will describe a manufacturing method of the power semiconductor module shown in FIG. 8 with reference to FIG. 11. A difference of the fifth embodiment from the second embodiment described above is a forming method of insertion holes for the bolts 14 communicating with the through-holes 10 and having a diameter larger than the diameter of the through-holes 10. In contrast to the insertion holes 12 of the first embodiment described above that are formed in a circular shape by the molded products 15 in the shape of a circular column, the insertion holes 24 of the fifth embodiment are obtained by forming molded products 25 formed so as to open also to the side faces of the transfer mold resin body 11 integrally with a die 26. In short, the insertion holes 24 opening not only in the direction to the top face but also in the direction to the side faces are formed. FIG. 12 shows the shape of the molded products 25 formed integrally with the die 26.

The manufacturing method of the power semiconductor module of the fifth embodiment will be described. It is normal that the through-holes 10 are preliminarily made in the metal base plate 1 of the circuit board 4. A construct is formed by mounting the power semiconductor elements 5 and the tubular external terminal connection bodies 7 on the circuit board 4 and by providing circuit forming portions formed of wire bonds 9 that electrically connect the respective power semiconductor elements 5 and the wiring pattern 3. The construct is positioned inside the die 26 by placing the face 1b of the metal base plate 1 on the other side to abut on the inner bottom face of the die 26, clogging the through-holes 10 with the molded products 25 attached to the die 26 so that the insertion holes 24 for the bolts 14 communicating with the through-holes 10 and having a diameter larger than the diameter of the through-holes 10 open also to the side faces of the transfer mold resin body 11, and placing the top portions of the tubular external terminal connection bodies 7 and the top portions of the molded products 25 to abut on the inner top face of the die 26, while maintaining a predetermined interval between the side faces of the metal base plate 1 and the inner side faces of the die 26. After the positioning, a clearing portion defined by the construct and the molded products 25 inside the die 26 is filled with mold resin, for example, epoxy resin filled with silica powder, as a filler. The transfer mold resin body 11 is thus formed. Thereafter, the insertion holes 24 for the bolts 14 communicating with the through-holes 10 and having a diameter larger than the diameter of the through-holes 10 are formed so as to open also to the side faces of the transfer mold resin body 11 by releasing the transfer mold resin body 11 from the die 26. The manufacturing of the power semiconductor module described above with reference to FIG. 8 is thus completed.

According to the fifth embodiment, because the molded products 25 are formed integrally with the die 26, the positioning step as described in the second embodiment above can be omitted. The manufacturing costs can be thus reduced.

The molded products 25 of the fifth embodiment are formed integrally with the die 26. However, when consideration is given to a variance in thickness of the metal base plate 1, by configuring in such a manner that the molded products 25 are attached to the die 26 movably and adjustably, it becomes possible to prevent mold resin from flowing while the transfer mold resin body 11 is formed. Consequently, the transfer mold resin body 11 can be formed in a stable manner.

It should be appreciated that the molded products 15 may be attached to the die 16 in the second embodiment above on the basis of the idea same as the idea of the fifth embodiment.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor module, comprising:
    a circuit board formed of a metal base plate, a thermally conductive insulating layer joined to a face of the metal base plate on one side, and a wiring pattern provided to a face of the thermally conductive insulating layer on a side opposite to the face joined to the metal base plate;
    a power semiconductor element joined to an element mount portion of the wiring pattern;
    a tubular external terminal connection body provided to the wiring pattern, to which an external terminal is connected by insertion; and
    a transfer mold resin body encapsulated in such a manner that a face of the metal base plate on an other side opposite the thermally conductive layer and a top portion of the tubular external terminal connection body are exposed, and the one side and side faces of the metal base plate, the power semiconductor element, and the tubular external terminal connection body are covered,
wherein:
    the metal base plate is provided with a through-hole and an attachment member placed in the through-hole and fixing a cooling fin to the face of the metal base plate on the other side; and
    the transfer mold resin body is provided with an insertion hole for the attachment member communicating with the through-hole and having a diameter larger than a diameter of the through-hole,
    wherein the insertion hole is formed to open also to a side face of the transfer mold resin body.

2. The power semiconductor module according to claim 1, wherein:
    the diameter of the insertion hole is made larger than the diameter of the through-hole to allow a head portion of the attachment member to come into contact with a metal surface of the metal base plate in an outer peripheral rim portion of the through-hole.

3. The power semiconductor module according to claim 1, wherein:
    a height of the transfer mold resin body on the metal base plate is made higher than a height of a head portion of the attachment member inserted into the insertion hole.

* * * * *